United States Patent
Okutani et al.

(10) Patent No.: US 6,497,762 B1
(45) Date of Patent: *Dec. 24, 2002

(54) METHOD OF FABRICATING CRYSTAL THIN PLATE UNDER MICRO-GRAVITY ENVIRONMENT

(75) Inventors: Takeshi Okutani, Sapporo (JP); Hideki Minagawa, Kitahiroshima (JP); Yoshinori Nakata, Sapporo (JP); Hideaki Nagai, Sapporo (JP); Masaaki Suzuki, Sapporo (JP); Takashi Tsurue, Sapporo (JP); Yoshiho Ito, Kitahiroshima (JP)

(73) Assignee: Director-General of Agency of Industrial Science and Technology (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/261,491

(22) Filed: Mar. 3, 1999

(30) Foreign Application Priority Data

Jul. 8, 1998 (JP) ............................................ 10-193446

(51) Int. Cl.$^7$ ............................ C30B 9/04; C30B 28/04
(52) U.S. Cl. ........................................ 117/75; 117/901
(58) Field of Search ................................ 117/73, 75, 81, 117/901

(56) References Cited

FOREIGN PATENT DOCUMENTS

JP  59217692 A  * 12/1983  ........... C30B/11/00

OTHER PUBLICATIONS

Bollong et al., Analysis of Cd0.21Hg0.79Te Quenched in 10–4 g, Jpurnal of Crystal Growth, 94 (1989) 475–480.*
Askeland, The Science and Engineering of Materials, 2nd Edition, PWS–Kent Publishing, Boston, MA, USA, 1989.*
Wolf et al. Silicon Processing for the VLSI Era vol. 1: Process Technology, Lattice Press, Sunset Beach, CA, USA, pp. 17–18, 56–58, 124, 1986.*
Muller, 'A Comparative Study of Crystal Growth Phenomena under Reduced and Enhanced Gravity,' Journal of Crystal Growth, 99 (1990) 1242–157, 1990.*
Wolf et al., Silicon Processing in the VLSI Era, vol. 1: Process Technology, Lattice Press, Sunset Beach, CA, USA, pp. 1, 17, 56–58, 1986.*

* cited by examiner

Primary Examiner—Gregory Mills
Assistant Examiner—Matthew Anderson
(74) Attorney, Agent, or Firm—Lorusso & Loud

(57) ABSTRACT

A method of fabricating a crystal thin plate of a substance capable of forming a crystal, wherein a molten layer of the substance formed on a support is cooled in the atmosphere of an inert gas or in vacuum at a rate of 10–300° C. per second under a micro-gravity environment to solidify and crystallize the molten layer. The cooling is performed by contacting a portion of the support with a cooling medium.

11 Claims, 1 Drawing Sheet

METHOD OF FABRICATING CRYSTAL THIN PLATE UNDER MICRO-GRAVITY ENVIRONMENT

BACKGROUND OF THE INVENTION

This invention relates to a method of fabricating a crystal thin plate under a micro-gravity environment.

Crystals of metal oxides, semiconductors, etc. have been hitherto grown from a liquid phase. Examples of such crystal forming methods include a crystal pulling method for forming a silicon semiconductor single crystal of or a metal oxide single crystal, a melt growth method for forming a semiconductor such as GaAs using a crucible and a floating-zone method for forming a silicon single crystal or a compound semiconductor without using a crucible.

One problem of the above conventional methods is that it is difficult to obtain a high quality crystal having no defects. Another problem is that a relatively long time is required for the production of crystals.

SUMMARY OF THE INVENTION

It is, therefore, an object of the present invention to provide a method of producing a high quality crystal thin plate within a short period of time.

In accordance with the present invention there is provided a method of fabricating a crystal thin plate of a substance capable of forming a crystal, which includes the steps of:

forming a molten layer of the above substance on a support; and cooling the molten layer in the atmosphere of an inert gas or in vacuum at a rate of 10–300° C. per second under a micro-gravity environment to solidify and crystallize the molten layer. The cooling is performed by contacting the support with a cooling medium.

BRIEF DESCRIPTION OF THE DRAWINGS

Other objects, features and advantages of the present invention will become apparent from the detailed description of the preferred embodiments of the invention which follows, when considered in light of the accompanying drawings, in which.

DETAILED DESCRIPTION OF THE PREFERRED EMBODIMENTS OF THE INVENTION

Figure 1:
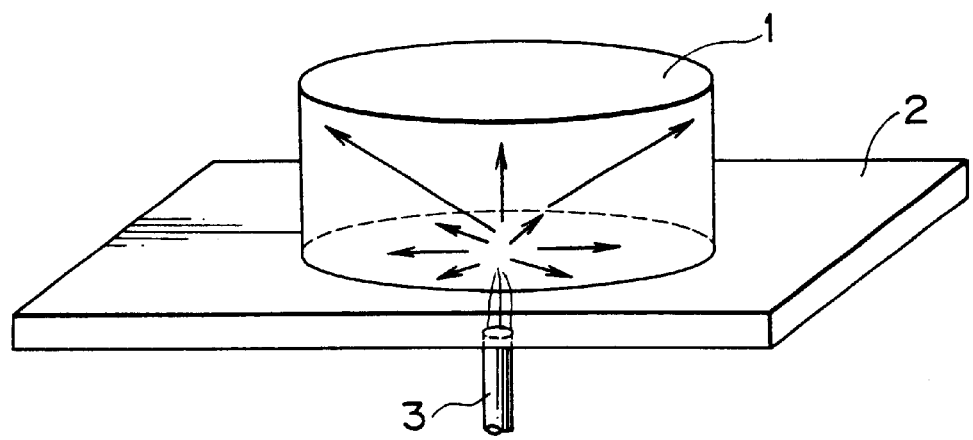
FIG. 1 is a schematic illustration explanatory of one embodiment of a cooling step of a method according to the present invention.

For the formation of a crystal thin plate, any substance capable of forming a crystal from a melt may be used as a raw material. Thus, metallic elements, metalloids, alloys, semiconductors and ceramics may be used for the purpose of the present invention. Illustrative of suitable raw material substances are Ti, Si, Ge, a Ti-Ni alloy, a Cu-Al alloy, indium antimonide (In-Sb), and metal garnet composite materials such as yttrium aluminum garnet.

The raw material substance is molten to form a molten layer on a support. Any heat resisting solid may be used as the support as long as it is inert to the raw material substance. Examples of the support include metal oxide plates, such as quartz glass plates and alumina plates; ceramic plates, such as boron nitride plates and aluminum nitride plates; graphite plates; metal plates coated with an oxide or ceramic layer, such as stainless steel plates coated with alumina, boron nitride or aluminum nitride.

The molten layer may be formed by heating the raw material which is preferably in the form of a powder or thin plate until the raw material melts. The molten layer has a thickness of generally 0.1–15 mm, preferably 0.3–5 mm. The formation of the molten layer is preferably performed in vacuum (20 Torr or less, preferably 1 Torr or less) or in the atmosphere of an inert gas such as argon or helium. The molten layer may be supported between a pair of supports, if desired.

The molten layer supported by the support is then cooled in the atmosphere of an inert gas or in vacuum at a rate of 10–300° C., preferably 100–200° C., per second under a micro-gravity environment to solidify and crystallize the molten layer.

The micro-gravity environment is under such conditions that the gravity is not greater than $10^{-2}$ g, preferably not greater than $10^{-3}$ g. The inert gas may be, for example, helium or argon. The vacuum is generally 20 Torr or less, preferably 1 Torr or less. When the molten layer has a relatively high vapor pressure, the cooling is preferably performed under a high pressure of an inert gas.

The cooling of the molten layer is performed by contacting the support with a cooling medium such as liquid nitrogen.

When a melt solidifies, a stress is generated by expansion or reduction. Such a stress might cause a defect of a crystal. Thus, it is desirable that the molten layer be cooled such that the solidification starts at one portion thereof (including a small area of a surface of the molten layer as well as one of the entire surface of the molten layer) and propagates throughout the molten layer without causing such a stress. Thus, it is better not to start the solidification from two or more spaced apart portions of the molten layer.

Figure 2:
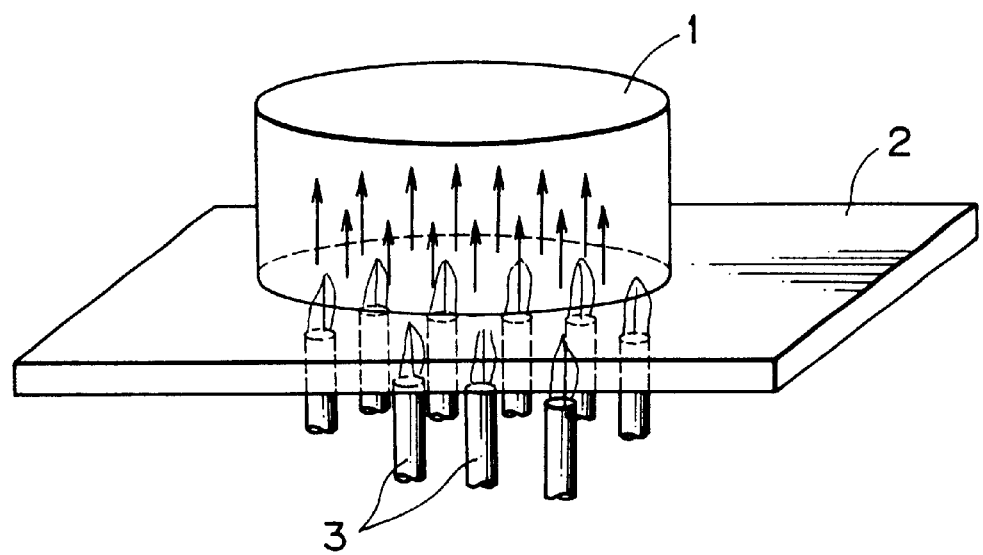
FIG. 2 is a schematic illustration explanatory of another embodiment of a cooling step of a method according to the present invention.

Accordingly, for example, it is advisable that the cooling of the support be carried out by contacting a small area of the support with the cooling medium as schematically shown in FIG. 1 or by contacting a large area of the support simultaneously with the cooling medium as schematically shown in FIG. 2. In FIGS. 1 and 2, designated as 1 is a molten layer, as 2 a support and as 3 an injection nozzle for injecting liquid nitrogen. The arrows shown in FIGS. 1 and 2 are directions in which solidification progresses. The arrows in FIG. 1 show solidification of the molten layer 1 progressing radially outward from the point of contact between the cooling medium exiting injection needle 3 and a minor portion of the support 2. The arrows in FIG. 2 show solidification molten layer 1 progressing from the interface between the support 2 and the span of the (inner) surface of the molten layer 1 in contact with the support 2 in a single, straight line direction outward from that inner surface.

When the molten layer is formed between a pair of supports, it is important that the cooling should be performed by cooling one of the supports.

The crystal thin plate obtained by the method according to the present invention has no crystal defects. It is, thus, possible to obtain a high quality single crystal. The method of the present invention can also produce a high quality polycrystal thin plate having no defects in each crystal grain.

The following examples will further illustrate the present invention.

EXAMPLE 1

A drop tower of a 10 m tall at Hokkaido National Industrial Research Institute (Hokkaido, Japan) was used for forming a micro-gravity environment. A gravity of $10^{-3}$ g can be established for 1.4 seconds with this tower.

Between a pair of spaced apart square quartz glass plates with a gap therebetween of 2 mm and each having a size of 50 mm×50 mm and a thickness of 2 mm, 1.5 g of germanium powder were placed. The glass plates were secured within a glass vessel with one glass plate being in contact with the inside wall of the glass vessel. The inside of the glass vessel was maintained in vacuum (13.3 mPa). A platinum wire was wound around the glass vessel with both ends thereof being connected to a 12V AC voltage source through a switch. The switch was turn ON to heat and to melt the germanium powder placed in the gap between the glass plates.

While the temperature of the molten mass was maintained at 1, 150° C., the vessel was set in a luck provided with 25 injection nozzles each having an outer diameter of 6.3 mm and bound together into a bundle such that the nozzles are oriented to that outer surface of the vessel corresponding to the above-mentioned glass plate contacted with the inside wall of the vessel. The injection nozzles were connected through a valve to a liquid nitrogen reservoir in the luck.

The luck was dropped from the top of the tower. Simultaneously with the start of the drop of the luck, the switch was turned OFF to stop the heating and the valve was opened to inject liquid nitrogen through the nozzles toward the glass vessel in an amount of 200 g/second, so that the molten layer was cooled at a rate of 80° C. per second during the drop. The glass vessel was taken from the luck on the bottom of the tower to recover a crystal disc having a diameter of about 40 mm and a thickness of about 2 mm.

The disc was immersed in a 60% by weight nitric acid containing 2% by weight of HF to etch a surface thereof. A microscopic analysis revealed that the etched surface had a uniform morphology having no crystal grains. A SEM analysis revealed 0.326 nm of a lattice spacing, showing a (111) face of a germanium crystal. The germanium disc obtained was found to be a germanium single crystal.

For the purpose of comparison, the solidification of germanium molten layer was carried out on the grounds (under a gravity of 1 g). The disc obtained was found to contain defects.

EXAMPLE 2

A drop tower of a 490 m tall at Japan Microgravity Center (Hokkaido, Japan) was used for forming a micro-gravity environment. A gravity of $10^{-4}$ g can be established for 10 seconds with this tower.

A mixture of indium powder and antimony powder having a molar ratio of 1:1 was placed between a pair of spaced apart square quartz glass plates in the same manner as that in Example 1. The glass plates were secured within a glass vessel maintained in the atmosphere of argon at 133 Pa and provided with a platinum wire heater. The vessel was set in a luck as used in Example 1 and the luck was dropped from a top of the tower. The mixed powder was heated at 618.5° C. immediately before the drop to form a molten layer. The molten layer was further heated so that a temperature of 1045.5° C. was reached 7 seconds after the start of the drop. Then, the molten layer was cooled with liquid nitrogen for 3 seconds so that the thin plate was cooled to 514.5° C. to obtain indium antimonide thin plate having a melting point of 525° C. The thin plate was found to have no crystal defects.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. A method of fabricating a crystal in the form of a thin plate of a substance capable of forming a crystal, comprising the steps of:

forming a molten layer of said substance on a support; and cooling said molten layer, in an atmosphere of an inert gas or in vacuum, at a rate of 10–300° C. per second in a micro-gravity environment to solidify and crystallize said molten layer, wherein said cooling is performed by contacting a minor portion of said support with a cooling medium to cause solidification of said molten layer to progress radially outward from said minor portion.

2. A method as claimed in claim 1, wherein said substance is selected from the group consisting of metallic elements, metalloids, alloys, semiconductors and at ceramics.

3. A method as claimed in claim 1, wherein said substance is selected from the group consisting of Ti, Si, Ge, a Ti-Ni alloy, a Cu-Al alloy, indium antimonide and metal garnet composite materials.

4. A method as claimed in claim 1, wherein said molten layer is formed between a pair of supports and wherein said cooling is performed by cooling one of said supports.

5. A method as claimed in claim 1 wherein said rate of cooling is 100–200° C. per second.

6. A method as claimed in claim 1 wherein the cooling medium is a liquid.

7. A method as claimed in claim 1 wherein the cooling medium is liquid nitrogen.

8. A method as claimed in claim 1 wherein said thin plate is a single crystal.

9. A method of fabricating a crystal in the form of a thin plate of a substance capable of forming a crystal, comprising the steps of:

forming a molten layer of said substance on a support; and cooling said molten layer, in an atmosphere of an inert gas or in vacuum, at a rate of 10–300° C. per second in a micro-gravity environment to solidify and crystallize said molten layer, wherein said cooling is performed by contacting an area of said support with a cooling medium to cause solidification of said molten layer to initiate throughout an inner surface of said molten layer in contact with said support and to progress entirely in a single straight line direction outward from said inner surface.

10. A method as claimed in claim 9 wherein the cooling medium is a liquid.

11. A method as claimed in claim 9 wherein the cooling medium is liquid nitrogen.

* * * * *